United States Patent [19]
Lawrence

[11] Patent Number: 5,239,189
[45] Date of Patent: Aug. 24, 1993

[54] INTEGRATED LIGHT EMITTING AND LIGHT DETECTING DEVICE

[75] Inventor: David J. Lawrence, Rochester, N.Y.

[73] Assignee: Eastman Kodak Company, Rochester, N.Y.

[21] Appl. No.: 711,699

[22] Filed: Jun. 7, 1991

[51] Int. Cl.[5] .......................................... H01L 33/00
[52] U.S. Cl. ...................................... 257/81; 257/82; 257/99; 257/458
[58] Field of Search ............... 357/17, 19, 30; 257/81, 257/82, 99, 458, 466

[56] References Cited

U.S. PATENT DOCUMENTS

| | | | |
|---|---|---|---|
| 4,176,367 | 11/1979 | Uematsu | 357/19 |
| 4,695,859 | 9/1987 | Guha et al. | 357/19 |
| 4,736,231 | 4/1988 | Ayabe et al. | 357/19 |
| 4,737,196 | 4/1988 | Yukimoto | 357/30 |
| 4,829,345 | 5/1989 | Ishioka et al. | 357/19 |
| 4,871,224 | 10/1989 | Karstensen et al. | 350/96.5 |
| 4,884,119 | 11/1989 | Miller | 357/19 |
| 4,906,839 | 3/1990 | Lee | 250/239 |
| 5,024,706 | 6/1991 | Kanai et al. | 357/30 |

FOREIGN PATENT DOCUMENTS

| | | | |
|---|---|---|---|
| 57-166081 | 10/1982 | Japan | 357/19 |
| 57-199272 | 12/1982 | Japan | 357/19 |
| 62-119981 | 6/1987 | Japan | 357/19 |
| 3-016265 | 1/1991 | Japan | 357/19 |

*Primary Examiner*—Andrew J. James
*Assistant Examiner*—Stephen D. Meier
*Attorney, Agent, or Firm*—Raymond L. Owens

[57] ABSTRACT

An integrated semiconductor device includes a pair of spaced apart regions of semiconductor material on a surface of a substrate of semiconductor material. One of the regions is a light emitting device and the other region is a light detector device. Each of the regions is formed of a first layer on the substrate surface of a composition suitable for serving as a light detector active layer. Additional layers are on the first layer with at least one of the additional layers being of a composition to act as a light emitter active layer. A contact layer may be provided on the additional layers. The light detector region has a highly conductive region extending through the additional layers and slightly into the light detector active layer. The light emitter region may have a highly conductive region extending through some of the additional layers to the light emitting active layer. Thus, both the light emitting region and the light detecting region are formed from the same layers of semiconductor material.

24 Claims, 3 Drawing Sheets

INTEGRATED LIGHT EMITTING AND LIGHT DETECTING DEVICE

FIELD OF THE INVENTION

The present invention relates to an integrated semiconductor device which includes both a light emitter and a light detector, and, more particularly, to an integrated light emitting and light detecting semiconductor device in which the same layers are included in both devices.

BACKGROUND OF THE INVENTION

Optical communication systems use light emitting devices to generate light and serve as the source of a light beam, and use a light detector for detecting the light and converting the light to an electrical signal. To minimize the size of the device, both the light emitter and light detector are preferably semiconductor devices, such as light emitting diodes and photodiodes. In order to further reduce the size of the device, and to allow the emitter and detector be incorporated with circuitry for operating the device, it is desirable to be able to form integrated devices having both the light emitter and the light detector on a single substrate.

One problem in integrating a semiconductor light emitter and light detector on a single substrate results from the fact that the requirements for the semiconductor active layer or layers for each of these devices is different to achieve optimum operating characteristics for each. Also, if the same layer is used as the active layer for both the light emitter and the light detector, during the operation of the device, the emitter heats more than the detector since it operates at a higher current density. Heating causes the emitter wavelength to increase, and the emitted light is no longer efficiently absorbed by the detector. Therefore, it has been the practice to deposit on a substrate a set of layers of materials suitable for a light emitting diode, and a second set of layers of material suitable for the light detector. In some integrated devices, the different layers are deposited on opposite sides of a substrate. However, for integrated circuits, it is desirable to form the layers on the same side of a substrate. To form different layers for the two devices on the same side of a substrate becomes complex. Therefore, it would be desirable to be able to form both devices from the same layers so as to simplify making the integrated circuit having both devices therein.

SUMMARY OF THE INVENTION

A semiconductor integrated device which includes both a light emitting device and a light detector has on a surface of a substrate a plurality of layers of semiconductor material. One of the layers is of a composition suitable for a light detector and the other layers are of a composition suitable for a light emitter. The layers are separated into two regions, one forming the emitter and the other the detector. In the detector region, a conductive region extends through the layers suitable for the light emitter to short them out and make contact with the layer suitable for the light detector.

More particularly, the integrated circuit comprises a substrate having on a surface thereof a plurality of superimposed layers of semiconductor material. One of the layers is of a composition suitable for the active layer of a light detector and at least one of the other layers is of a composition suitable for the active layer of a light emitter. The layers are divided into at least two spaced regions. At least one of the regions forms a light emitter. At least one of the other regions has a conductive region extending through the other layers to short them out and contacts the one layer to form a light detector.

Viewed from another aspect, the present invention is directed to a semiconductor integrated device comprising a substrate of a semiconductor material having a surface. A plurality of superimposed layers of semiconductor material are on the substrate surface and are divided into at least two regions. One of the layers is of a composition suitable for detecting light and converting the light to electrons and holes. At least one of the other layers is of a material suitable for generating and emitting light. Contacts are on one of the regions at opposite sides of the layers for forming a light emitter. A conductive region extends through the other layers in the other region to the one layer to form a light detector.

The invention will be better understood from the following more detailed description taken with the accompanying drawings.

It should be understood that the drawings are not necessarily drawn to scale.

DETAILED DESCRIPTION

Figure 1:
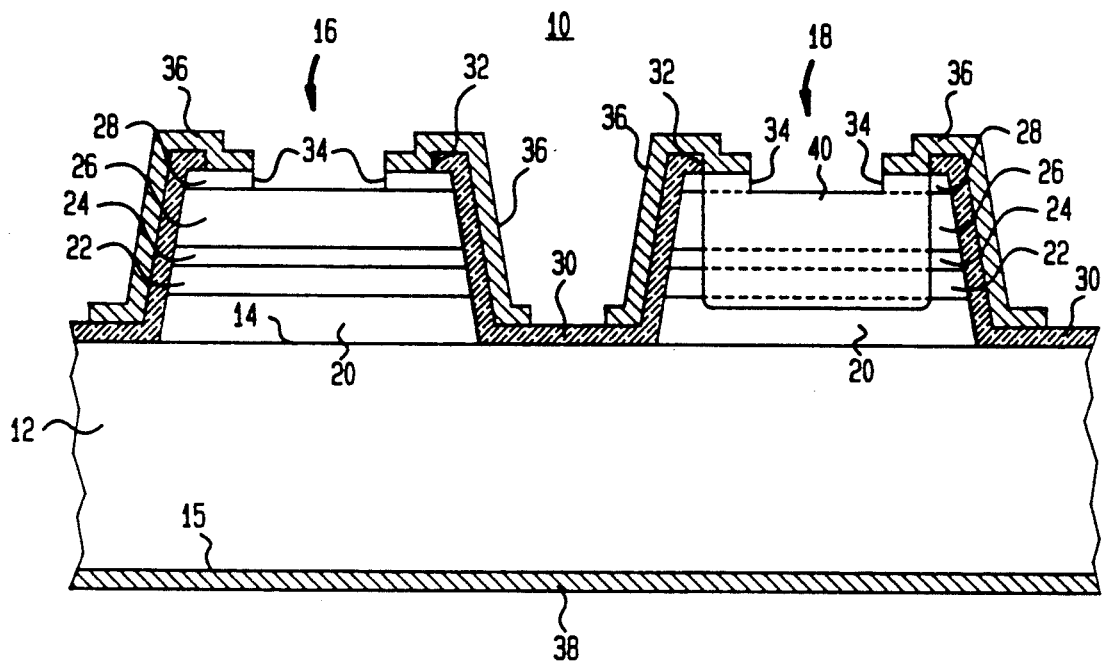
FIG. 1 is a cross-sectional view of a first integrated device in accordance with the present invention.

Referring now to FIG. 1, there is shown a first integrated device 10 in accordance with the present invention. The integrated device 10 comprises a substrate 12 of an n-type conductivity (typically doped to about 1 to $3 \times 10^{18}$ impurities/cm$^3$) semiconductor material having on a surface 14 thereof spaced apart first and second regions 16 and 18. The first region 16 forms a semiconductor light emitting diode and the second region 18 forms a photodiode.

Each of the first and second regions 16 and 18 comprises a first layer 20 of an n-type conductivity (typically doped to about $1 \times 10^{15}$ impurities/cm$^3$) semiconductor material of a composition suitable for a light detector active layer, typically $Al_zGa_{1-z}As$. On the detector active layer 20 is a second layer 22 of an n-type conductivity (typically doped to about $1 \times 10^{18}$ impurities/cm$^3$) semiconductor material of a composition suitable for a window layer of a light emitting diode, typically $Al_yGa_{1-y}As$. On the window layer 22 is a third layer 24 of a semiconductor material of a composition suitable for the active layer of a light emitting diode. The light emitter active layer 24 may be of $Al_xGa_{1-x}As$ of either conductivity or intrinsic. However, it is preferably of a well known quantum well structure, either a single quantum well or multiple quantum well structure. On the light emitter active layer 24 is a fourth layer 26 of a p-type conductivity (typically doped to about $1 \times 10^{17}$ impurities/cm$^3$) semiconductor material of a composition suitable for a window layer of the light emitting diode, typically $Al_wGa_{1-w}As$. On the window layer 26 is a fifth layer 28 of a highly conductive p-type conductivity (p+ type having an impurity concentration of about $1\times10^{19}$ impurities/cm$^3$) semiconductor material of a composition suitable for a contact layer, typically GaAs.

Examples of suitable compositions for the various layers are w=0.35, y=0.35 and z=0. The light emitter active layer 24 can be homogeneous with x=0.1. However, preferably, it is a single or multiple quantum well having a structure, for example, of 10 nanometers thick layers of GaAs separated by 10 nanometers thick barrier layers of $Al_{0.2}Ga_{0.8}As$. The substrate 12 is of a highly conductive n-type conductivity (n+ type) semiconductor material, such as GaAs.

A layer 30 of a dielectric material, such as silicon dioxide or silicon nitride, covers the exposed areas of the substrate surface 14 and the first and second regions 16 and 18. The dielectric layer 30 has openings 32 therethrough over the contact layers 28 of the first and second regions 16 and 18. Each of the contact layers 28 has an opening 34 therethrough to expose a portion of the underlying window layer 26 of each of the first and second regions 16 and 18. A separate p-type contact layer 36 of a suitable conductive material, such as a metal, metal alloy or multiple layers of the metals and alloys, is on the dielectric layer 30 on each of the first and second regions 16 and 18 and extends through the openings 32 in the dielectric layer 30 to the contact layers 28. An n-type contact layer 38 of a suitable conductive material is on the surface 15 of the substrate 12.

In the second region 18, which forms the light detector, a highly conductive p-type conductivity (p+ type) region 40 extends through the contact layer 28, window layer 26, emitter active layer 24, window layer 22 and slightly into the detector active layer 20. The conductive region 40 shorts out the layers it extends through and makes contact with the detector active layer 20. The highly conductive region 40 is formed by a diffusion of a p-type impurity, such as zinc.

In the operation of the integrated device 10, the first region 16 functions as a light emitting diode. When an appropriate voltage is applied between the p-type contact layer 36 of the first region 16 and the n-type contact layer 38, oppositely charged carriers flow into the active layer 24 where they recombine to generate light. The light is then emitted from the diode 16 through the window layer 26 and the opening 34 in the contact layer 28. The composition of the materials of the window layers 22 and 26 and the light emitter active layer 24 are chosen to provide good light generating and emitting properties.

The second region 18 functions as a light detector. Light enters the light detector 18 through the opening 34 in the contact layer 28 of the second region 18. The photons of the light pass through the highly conductive region 40 in the layers 26, 24 and 22 and enter the detector active layer 20. In the detector active layer 20, the photons are converted to electrons and holes which are separated by the electric field of the p-n junction and produce a photocurrent between the contacts 36 and 38. In the second region 18, the detector active layer 20 is of a material which facilitates a high level of conversion of photons to electrons and holes. The p+ type region 40 allows the photons to pass through the layers 26, 24 and 22 to the detector active layer 20 with a low level of absorption of the photons.

To make the integrated device 10, the layers 20, 22, 24, 26 and 28 are deposited in succession on the substrate surface 14. This can be done using any well known epitaxial deposition technique for the particular materials, such as liquid phase or vapor phase epitaxy. A masking layer is then formed on the layer 28 over the area of the substrate surface 14 where the various regions which form the light emitting and light detecting regions are to be formed. Although the integrated device 10 is shown as having only two such regions, one light emitting region 16 and one light detecting region 18, the integrated device 10 may be provided with many more of such regions depending on the number of light emitting diodes and/or photodiodes desired. The exposed areas of the layers are then removed in succession using a suitable etchant for the particular material of the layer to form the spaced regions 16 and 18.

The dielectric layer 30 is then deposited over the spaced regions and the exposed area of the substrate surface 14 using, for example, a chemical vapor deposition technique. The openings 32 are then formed in the dielectric 30 over the contact layers 28 using a suitable etchant while masking the portions of the dielectric layer to be maintained. The regions which are to form light emitting diodes are then covered with a masking layer and zinc is then diffused into the regions which are to form the light detecting devices through the openings 32 in the dielectric layer 30. The zinc is diffused through the layers 28, 26, 24 and 22 and slightly into the detector active layer 20. By having the amount of aluminum in the detector active layer 20 less than that in the window layer 22, the zinc diffusion slows when the diffusion front reaches the interface between the window layer 22 and the detector active layer 20. Then makes the process control for the diffusion more straightforward.

The metal contact layers 36 and 38 are then coated on the device using any well known technique for depositing the metals or alloys used, such as evaporation in a vacuum, sputtering or chemical vapor deposition. When depositing the p-type contact layer 36, a masking material may be first applied over the exposed areas of the window layers 26 as well as any other area of the dielectric layer 30 where the contact is not desired. After the p-type contact layer 36 is deposited, the masking material is removed, lifting off the undesired areas of the p-type contact metal. The openings 34 in the contact layers 28 are typically formed after the deposition and patterning of contact layer 36 using a suitable etchant.

Figure 2:
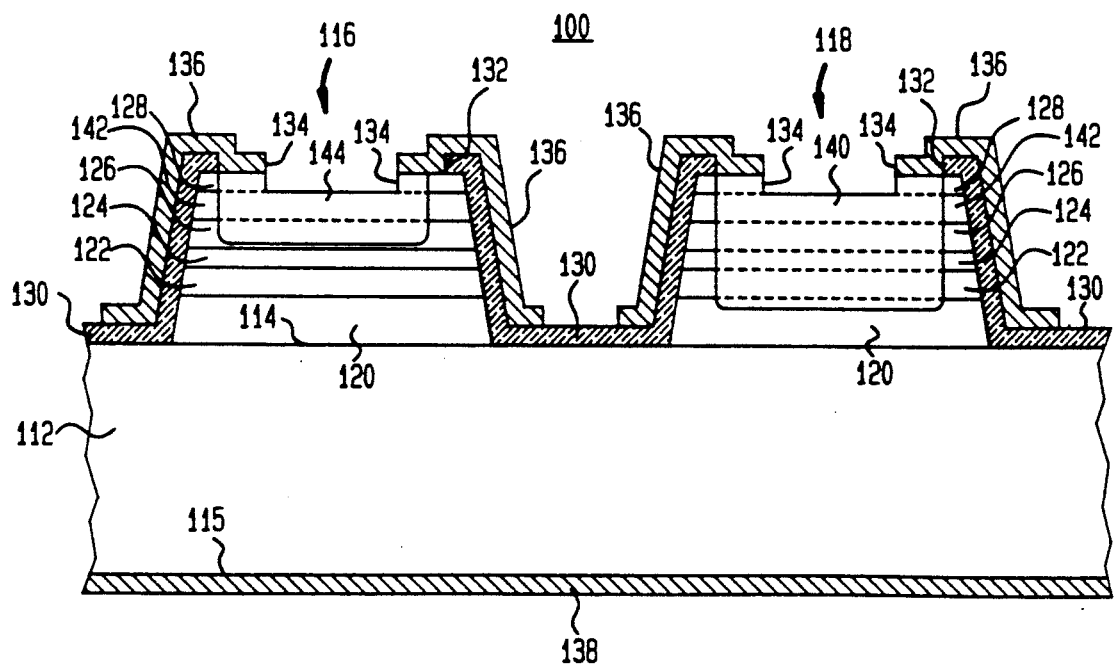
FIG. 2 is a cross-sectional view of a second integrated device in accordance with the present invention.

Referring now to FIG. 2, there is shown a second integrated device 100 in accordance with the present invention. The integrated device 100 is similar to the integrated device 10 shown in FIG. 1. Therefore, elements of the integrated device 100 which are the same as those of the integrated device 10 are indicated by the same reference number with the addition of the prefix "1". Thus, the integrated device 100 comprises a substrate 112 having at least two spaced apart regions 116 and 118 on a surface 114 thereof. As in the integrated device 10, each of the regions 116 and 118 includes on the substrate surface 114 in succession a detector active layer 120 of n-type conductivity $Al_zGa_{1-z}As$, a window layer 122 of n-type conductivity $Al_yGa_{1-y}As$, a light emitter active layer 124, which may be of $Al_xGa_{1-x}As$ or a quantum well structure, and a window layer 126 of p-type conductivity $Al_wGa_{1-w}As$. In addition, a window and blocking layer 142 of n-type conductivity (typically doped to $2 \times 10^{17}$ impurities/cm$^3$) Al$_u$Ga$_{1-u}$As is on the window layer 126. A contact layer 128 of n-type conductivity GaAs is on the window and blocking layer 142. The contact layers 128 have openings 134 therethrough to expose a portion of the window and blocking layers 142.

A dielectric layer 130 is over the exposed area of the substrate surface 114 and the regions 116 and 118. The dielectric layer 130 has openings 132 therethrough over the openings 134 in the contact layers 128. P-type contact layers 136 are provided over the regions 116 and 118 and an n-type contact layer 138 is on the substrate surface 115. In the detector region 118 a highly conductive p-type region 140 extends through the layers 128, 142, 126, 124 and 122 and slightly into the detector active layer 120. In the light emitting region 116, a highly conductive p-type region 144 extends through the layers 128 and 142 to the window layer 126. Each of the p+ type regions 140 and 144 are formed by a zinc diffusion.

The integrated device 100 is made in the same manner as the integrated device 10 previously described with the addition of depositing the window and blocking layer 142 and of carrying out a second zinc diffusion step to form the p+ type region 144 in the light emitting diode region 116. By having the content of aluminum in the window and blocking layer 142 greater than that in the window layer 126, i.e., u>w, there is provided a diffusion front which slows down as it enters the window layer 126, thereby making the process easier.

The integrated device 100 operates in the same manner as the integrated device 10 previously described. However, in the integrated device 100, the p+ type region 144 in the light emitting diode region 116 provides improved current confinement to the desired emitting area of the emitter active layer 124.

Figure 3:
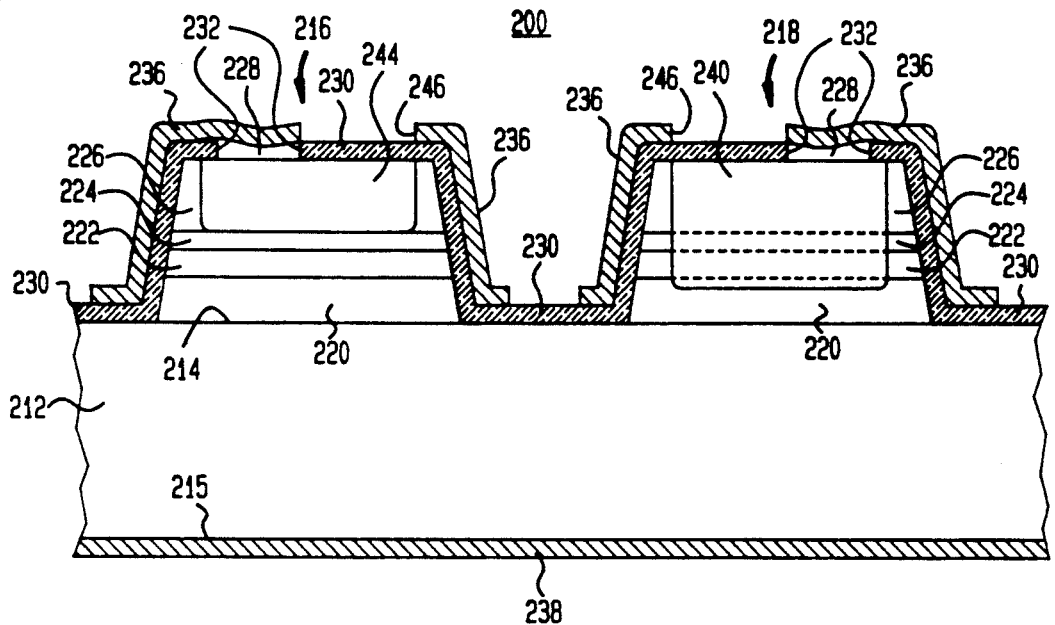
FIG. 3 is a cross-sectional view of a third integrated device in accordance with the present invention.

Referring now to FIG. 3, there is shown a third integrated device 200 in accordance with the present invention. The integrated device 200 is similar to that of integrated device 10 shown in FIG. 1 and similar parts are indicated by the reference numbers with the addition of the prefix "2". Integrated device 200 comprises a substrate 212 of n+ type GaAs having spaced apart light emitting and detecting regions 216 and 218 on a surface 214 thereof. Each of the regions 216 and 218 comprises on the substrate surface 214 in succession a light detector layer 220 of n-type conductivity Al$_z$Ga$_{1-z}$As, a window layer 222 of n-type conductivity Al$_y$Ga$_{1-y}$As, a light emitting active layer 224 of either n-type Al$_x$Ga$_{1-x}$As or a quantum well structure, and a window layer 226 of n-type conductivity Al$_w$Ga$_{1-w}$As. A dielectric layer 230 is over the regions 216 and 218 and the exposed area of the substrate surface 214. The dielectric layer 230 has openings 232 therethrough over the regions 216 and 218. A contact layer 228 of n-type conductivity GaAs is on the window layer 224 in each of the openings 232 in the dielectric layer 230. A separate p-contact layer 236 is on the dielectric layer 230 over each of the regions 216 and 218 and contacts the contact layer 228 of each respective region. Each of the p-contacts 236 has an opening 246 therethrough over its respective region 216 and 218 to allow light to pass therethrough into the respective region. An n-contact layer 238 is on the substrate surface 215. In the detector region 218, a p+ type region 240 extends through the contact layer 228, window layer 226, emitter active layer 224, window layer 222 and slightly into the detector active layer 220. In the light emitter region 216, a p+ type conductivity region 244 extends through the contact layer 228 and the window layer 226 to the light emitting active layer 224. If the light emitting active layer 224 is of uniform composition, the region 244 can extend into the light emitting active layer 224. However, if the light emitting active layer 224 is a quantum well or multiple quantum well structure, the region 244 should not extend into the light emitting active layer 224.

The integrated device 200 is made in a manner similar to the integrated device 10 shown in FIG. 1 previously described except that all of the layers deposited on the substrate 212 are of n-type conductivity. After the regions 216 and 218 are divided, zinc diffusions are carried out separately into the light emitting region 216 and detector region 218 to form the p+ type regions 244 and 240. A portion of each of the contact layers 228 is then removed so that the contact layers 228 are smaller than the window layers 226. The dielectric layer 230 is then deposited over the regions 216 and 218 and the exposed area of the substrate surface 214. The openings 232 are then etched through the dielectric layer 230 over the contact layers 228. The p-contact layers 236 and the n-contact layer 238 are then deposited. In the integrated device 200, the p-type diffused regions 244 and 240 provide the light emitter 216 and light detector 218 with well-defined active regions. This provides high light emitting and detecting efficiency, low leakage currents and good electrical isolation between neighboring devices.

Figure 4:
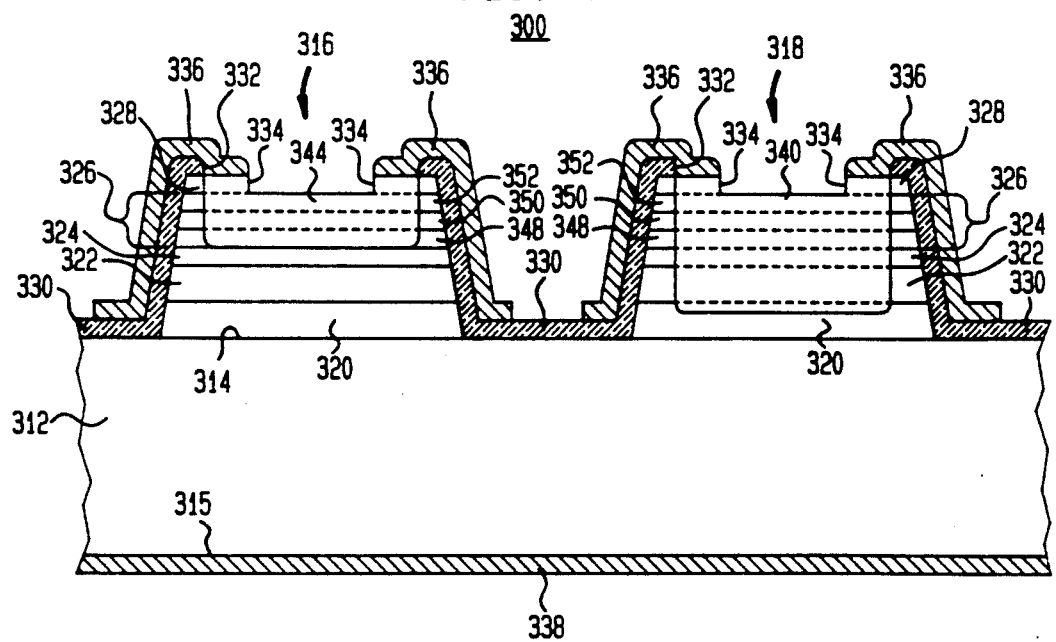
FIG. 4 is a cross-sectional view of a fourth integrated device in accordance with the present invention.

Referring now to FIG. 4, there is shown a fourth integrated device 300 in accordance with the present invention. Integrated device 300 is similar to the integrated device 10 shown in FIG. 1. Accordingly, similar parts are indicated by the same reference numbers with the addition of the prefix "3". Integrated device 300 comprises a substrate 312 of n+ type conductivity GaAs having on a surface 314 thereof spaced light emitting and detecting regions 316 and 318 respectively. Each of the regions 316 and 318 comprises on the substrate surface 314 in succession a detector active layer 320 of n-type conductivity Al$_z$Ga$_{1-z}$As, a window layer 322 of n-type conductivity Al$_y$Ga$_{1-y}$As, a light emitting active layer 324 of either n-type conductivity Al$_x$Ga$_{1-x}$As or a quantum well structure, and a window layer 326 of Al$_w$Ga$_{1-w}$As. The window layer 326 is formed of three superimposed layers 348, 350 and 352 with the outer layers 348 and 352 being of n-type conductivity and the inner layer 350 being of p-type conductivity. A contact layer 328 of n-type GaAs is on the window layer 326 and has an opening 334 therethrough. A dielectric layer 330 is on the regions 316 and 318 and the exposed area of the substrate surface 314. The dielectric layer 330 has openings 332 therethrough over the openings 334 in the contact layers 328. P-type contact layers 336 are on the regions 316 and 318 and an n-type contact layer 338 is on the substrate surface 315. The detector region 318 has a p+ type region 340 extending through the layers 328, 326, 324, 322 and partially into the detector active layer 320. The light emitter region 316 has a p+type region 344 extending through the layers 328, 326 to the emitter active layer 324. The region 344 can extend into the light emitting active layer 324 if the light emitting active layer 324 is of uniform composition, but should not extend into a quantum well structure light emitting active layer 324.

Integrated device 300 is made in a manner similar to the integrated device 10 of FIG. 1 previously described.

However, when the $Al_wGa_{1-w}As$ material of the window layer 326 is deposited, the conductivity type of the material is changed to form first the n-type layer 348, then the p-type layer 350 and finally the n-type layer 352. The integrated device 300 has the diffused p+ type regions in both the light emitter region 316 and the detector region 318 to provide well defined active regions in both devices. The layers of different conductivity type in the window layer 326 provide for good carrier blocking. This eliminates the need to remove the diffused lateral p-n junction in the cap layer 328 as was done in the integrated device 200 shown in FIG. 3.

Figure 5:
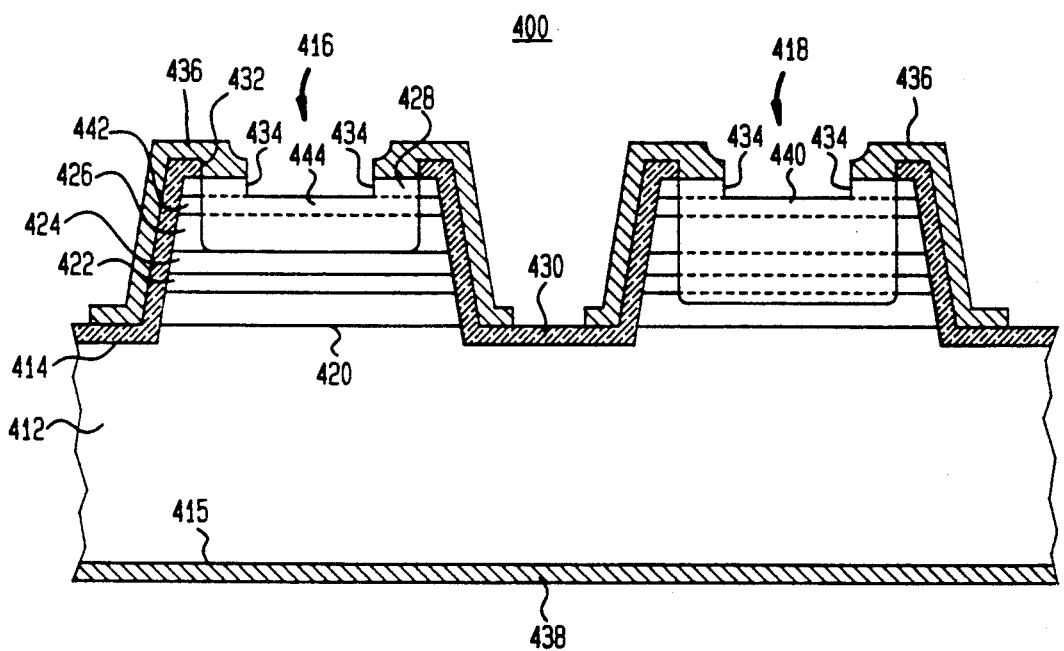
FIG. 5 is a cross-sectional view of a fifth integrated device in accordance with the present invention.

Referring to FIG. 5, there is shown a fifth integrated device 400 in accordance with the present invention. Integrated device 400 is similar to the integrated device 10 shown in FIG. 1. Accordingly, similar parts are indicated by the same reference numbers with the addition of the prefix "4". Integrated device 400 comprises a substrate 412 of n+ type conductivity GaAs having on a surface 414 thereof spaced light emitting and detecting regions 416 and 418 respectively. Each of the regions 416 and 418 comprises on the substrate surface 414 in succession a detector active layer 420 of n-type conductivity $Al_zGa_{1-z}As$, a window layer 422 of n-type conductivity $Al_yGa_{1-y}As$, a light emitting active layer 424 of either n-type $Al_xGa_{1-x}As$ or a quantum well structure, and a window layer 426 of n-type conductivity $Al_wGa_{1-w}As$. On the window layer 426 is a window and blocking layer 442 of p-type conductivity $Al_uGa_{1-u}As$. A contact layer 428 of n-type conductivity GaAs is on the window and blocking layer 442 and has an opening 434 therethrough. A dielectric layer 430 is on the regions 416 and 418 and the exposed area of the substrate surface 414. The dielectric layer 430 has openings 432 therethrough over the openings 434 in the contact layers 428. P-type contact layer 436 is on the regions 416 and 418 and an n-type contact layer 438 is on the substrate surface 415. The detector region 418 has a p+ type region 440 extending through the layers 428, 442, 426. 424, 422 and partially into the detector active layer 420. The light emitter region 416 has a p+ type region 444 extending through the layers 428, 442 and 426 to the emitter active layer 424. If the emitter active layer 424 is of uniform composition, the region 444 can extend into the emitter active layer 424.

Integrated circuit 400 is made in a manner similar to the integrated device 10 of FIG. 1 previously described. However, the window and blocking layer 442 is deposited on the window layer 426 prior to depositing the contact layer 428. The content of aluminum, u, in the window and blocking layer 442 can be greater than or equal to the content of aluminum, w, in the window layer 426. By having the window and blocking layer 442 between the window layer 426 and the contact layer 428, the removal of the diffused lateral p-n junction in the contact layer 428 becomes unnecessary.

Thus, there is provided by the present invention an integrated device having at least one light emitting diode and at least one photodiode on a common substrate with both devices being formed from the same layers. However, in each of the devices the active layer or layers of the device is formed of a material most suitable for the function of the device. In the light detector device, the highly conductive region extending to the light detector active layer provides for little absorption of the light entering the device before reaching the detector active layer so as to provide for a high efficiency device. Also, good electrical isolation is provided between the various devices on the substrate. Since both type of devices ar made from the same layers, the process of making the integrated device is simplified. In the light emitting regions of the integrated devices of the present invention, there is provided a heterojunction on each side of the emitter active layer to provide efficient carrier injection and confinement to the emitter layer.

It is to be appreciated and understood that the specific embodiments of the invention are merely illustrative of the general principles of the invention. Various modifications may be made consistent with the principles set forth. For example, although only one light emitting diode and one photodiode are shown for each form of the integrated device, the integrated device can contain any number of each of the device. Still further, although the devices have been described as being formed of various compositions of aluminum gallium arsenide and gallium arsenide, other similar materials may be used. In addition, the conductivity types of the various layers can be reversed. Still further, although the devices have been described as being spaced mesas formed by etching through the layers to electrically isolate the devices, other types of known isolation means, such as ion implantation, or dielectric or junction isolation can be used. Also, it is not necessary to etch completely through to the substrate to form the regions unless total optical isolation between devices is required. Furthermore, if desired, the contact layer may be eliminated from any of the forms of the integrated device.

What is claimed is:

1. A semiconductor integrated device comprising:
   a substrate of a semiconductor material having first and second opposed surfaces;
   a plurality of superimposed layers of semiconductor material on the first substrate surface and divided into at least a first light emitting region and a second light detecting region;
   one of said layers being of a composition suitable for detecting light and converting the light to electrons and holes;
   another layer comprising first and second window layers having therebetween a light emitting active layer of a material suitable for generating and emitting light, the first window layer being of the same conductivity type as the composition suitable layer, the second window layer being on the side of the light emitting active layer opposite the first window layer;
   a highly conductive region extending through the other layers in the second region to said one layer to form a light detector;
   a first contact layer on an outermost of the layers of each of the regions adjacent the second window layer, said first contact layer defining a window through which light can pass; and
   a second contact layer on the second surface of the substrate.

2. The integrated device of claim 1 in which the light emitter active layer is all of the same composition.

3. The integrated device of claim 1 in which the light emitting active layer is a quantum well structure.

4. The integrated device of claim 1 in which the light emitting active layer is a multiple quantum well structure.

5. The integrated device of claim 1 in which the highly conductive region which extends through the second region is of the opposite conductivity type.

6. The integrated device of claim 5 in which the one conductivity type is n-type and the opposite conductivity type is p-type.

7. The integrated device of claim 5 further comprising a highly conductive region of the opposite conductivity type extending through the layers other than the one layer to the emitter active layer in the light emitter region.

8. The integrated device of claim 7 in which both of the window layers are of the same conductivity type.

9. The integrated device of claim 8 in which both of the window layers are of n-type conductivity.

10. The integrated device of claim 7 further comprising a window and blocking layer of the opposite conductivity type between the contact layer and its adjacent window layer and the highly conductive regions extend through the window and blocking layer.

11. The integrated device of claim 7 in which the second window layer is of the opposite conductivity type.

12. The integrated device of claim 11 further comprising a window and blocking layer of the one conductivity type between the contact layer and its adjacent window layer and the highly conductive regions extend through the window and blocking layer.

13. The integrated device of claim 7 in which the second window layer adjacent the contact layer comprises three layers of alternating opposite conductivity type and the highly conductive regions extend through all of the layers of said window layer.

14. A semiconductor integrated device comprising:
    a substrate of highly conductive semiconductor material of one conductivity type having a pair of opposed surfaces;
    a pair of spaced apart regions of semiconductor material on one surface of said substrate, one of said regions being a light emitter and the other region being a light detector, each of said regions comprising:
    a light detecting active layer on said one substrate surface and of a composition suitable for converting photons to electrons and holes;
    a first window layer on the light detecting active layer and of the same conductivity type as the light detecting active layer;
    a light emitting active layer on said first window layer and of a composition suitable for generating and emitting light;
    a second window layer on said light emitting active layer;
    in one of said regions a highly conductive region extending through the window layers, the light emitting active layer and slightly into the light detector active layer;
    a first contact over and electrically connected to the second window layer of each of the regions and defining an opening therethrough through which light can pass into and out of the region; and
    a second contact on the other surface of the substrate.

15. The semiconductor integrated device of claim 14 in which the light detecting active layer and the first window layers are of the one conductivity type.

16. The semiconductor integrated device of claim 15 in which the light emitting active layer is of uniform composition.

17. The semiconductor integrated device of claim 15 in which the light emitting active layer is of a quantum well structure.

18. The semiconductor integrated device of claim 15 in which the light emitting active layer is of a multiple quantum well structure.

19. The semiconductor integrated device of claim 15 in which the second window layer is of the opposite conductivity type.

20. The semiconductor integrated device of claim 19 further comprising a window and blocking layer of a semiconductor material of the one conductivity type over the second window layer.

21. The semiconductor integrated device of claim 20 further comprising a highly conductive region of the opposite conductivity type extending through the layers of the light emitting region to the light emitting active layer.

22. The semiconductor integrated device of claim 21 further comprising a window and blocking layer of a semiconductor material of the opposite conductivity type over the second window layer.

23. The semiconductor integrated device of claim 15 in which the second window layer is of the one conductivity type and a highly conductive region of the opposite conductivity type extends through the layers of the light emitting region to the light emitting active layer.

24. The semiconductor integrated device of claim 15 in which the second window layers comprises three layers of alternating opposite conductivity type and a highly conductive region of the opposite conductivity type extends through the light emitting region to the light emitting active layer.

* * * * *